(12) United States Patent
Prodanov et al.

(10) Patent No.: US 7,031,690 B2
(45) Date of Patent: Apr. 18, 2006

(54) POLYPHASE FILTER WITH LOW-PASS RESPONSE

(75) Inventors: Vladimir Prodanov, New Providence, NJ (US); Peter Kiss, Morristown, NJ (US); Mihai Banu, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 429 days.

(21) Appl. No.: 10/294,411

(22) Filed: Nov. 14, 2002

(65) Prior Publication Data

US 2003/0186671 A1 Oct. 2, 2003

Related U.S. Application Data

(60) Provisional application No. 60/368,700, filed on Mar. 29, 2002, provisional application No. 60/371,939, filed on Apr. 11, 2002.

(51) Int. Cl.
*H04B 1/00* (2006.01)

(52) U.S. Cl. .................... 455/338; 455/307; 330/107

(58) Field of Classification Search ............... 455/338, 455/339, 340, 333, 334, 307; 330/107, 306, 330/257, 259; 713/401
See application file for complete search history.

(56) References Cited

U.S. PATENT DOCUMENTS 3,605,032 A * 9/1971 Kerwin .................. 330/107
5,105,163 A * 4/1992 Voorman ................ 330/107
6,704,560 B1 * 3/2004 Balteanu et al. ........... 455/333
2002/0068541 A1 * 6/2002 Helio et al. ............... 455/340
2003/0097601 A1 * 5/2003 Glas et al. ................. 713/401
2004/0043748 A1 * 3/2004 Yeo et al. .................. 455/334
2004/0166803 A1 * 8/2004 Moloudi et al. ............. 455/20

OTHER PUBLICATIONS

W. M. Snelgrove and A. S. Sedra, "State-Space Synthesis of Complex Analog Filters," in *Proc. of the European Conference on Circuit Theory and Design*, 1981, pp. 420-424.
A. A. Abidi, "Direct-Conversion Radio Transceivers for Digital Communications," *IEEE Journal of Solid State Circuits*, vol. 30, No. 12, pp. 1399-1410 (Dec. 1995).
B. Razavi, "Design Considerations for Direct-Conversion Receivers," *IEEE Transactions on Circuits and Systems—II: Analog and Digital Signal Processing*, vol. 44, No. 6, pp. 428-435 (Jun. 1997).

* cited by examiner

*Primary Examiner*—Nguyen T. Vo
*Assistant Examiner*—Blane J. Jackson

(57) ABSTRACT

A complex low-pass filter that reduces the influence of component mismatch. The filter includes a first filter section for effecting a first single pole transfer function and a second filter section for effecting a second single pole transfer function, where the first and the second single pole transfer functions collectively define a conjugate pair of poles. In higher order low-pass filters, an optimal cascade order follows a shoestring pattern.

21 Claims, 17 Drawing Sheets

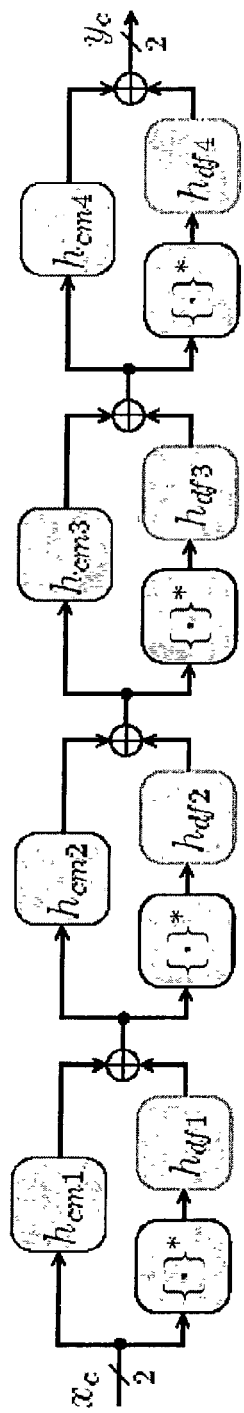
FIGURE 20
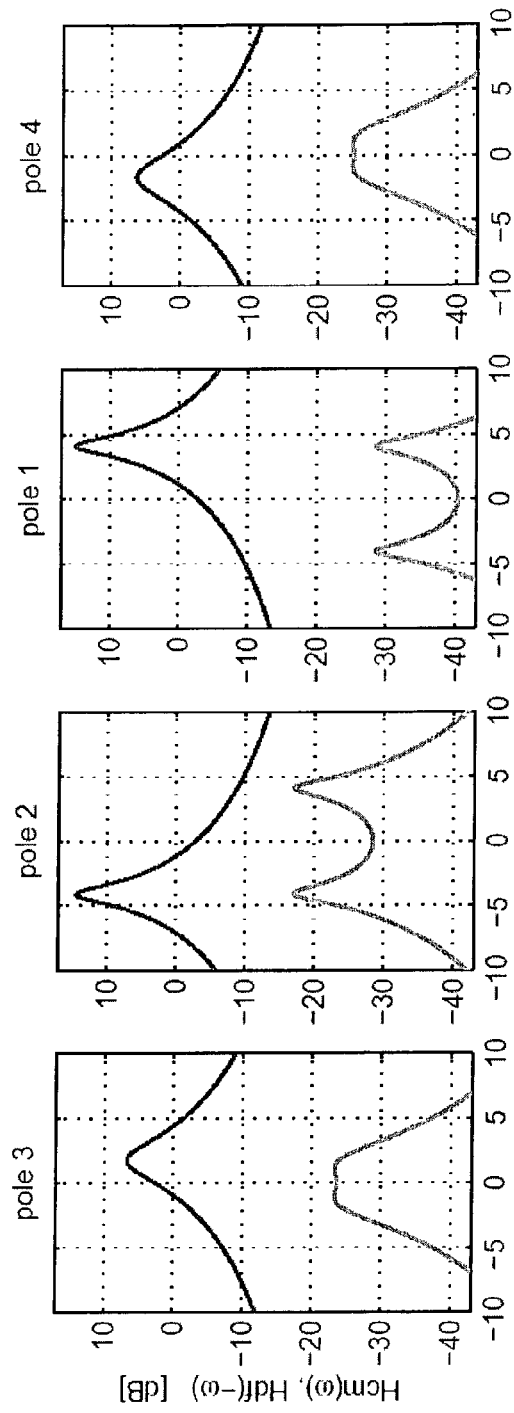
FIGURE 21
FIGURE 22
FIGURE 23
FIGURE 24

| $n$ | $code(n)$ | $n$ | $code(n)$ | $n$ | $code(n)$ | $n$ | $code(n)$ |
|---|---|---|---|---|---|---|---|
| 1 | 1-2-3-4 | 7 | 2-1-3-4 | 13 | 3-1-2-4 | 19 | 4-1-2-3 |
| 2 | 1-2-4-3 | 8 | 2-1-4-3 | 14 | 3-1-4-2 | 20 | 4-1-3-2 |
| 3 | 1-3-2-4 | 9 | 2-3-1-4 | 15 | 3-2-1-4 | 21 | 4-2-1-3 |
| 4 | 1-3-4-2 | 10 | 2-3-4-1 | 16 | 3-2-4-1 | 22 | 4-2-3-1 |
| 5 | 1-4-2-3 | 11 | 2-4-1-3 | 17 | 3-4-1-2 | 23 | 4-3-1-2 |
| 6 | 1-4-3-2 | 12 | 2-4-3-1 | 18 | 3-4-2-1 | 24 | 4-3-2-1 |

| $N$, order | 2 | 3 | 4 | 5 | 6 | 8 |
|---|---|---|---|---|---|---|
| $Q_{max}$ | 0.9 | 2.0 | 3.5 | 5.5 | 8.0 | 14.2 |
| $\overline{IMR_c}$ [dB] | 41.0 | 37.8 | 37.5 | 35.3 | 35.4 | 33.6 |
| $\overline{IMR_T}$ [dB] | 41.5 | 37.6 | 34.5 | 31.8 | 29.3 | 26.6 |
| $\Delta \overline{IMR}$ [dB] | -0.5 | 0.2 | 3.0 | 3.5 | 6.1 | 7.0 |

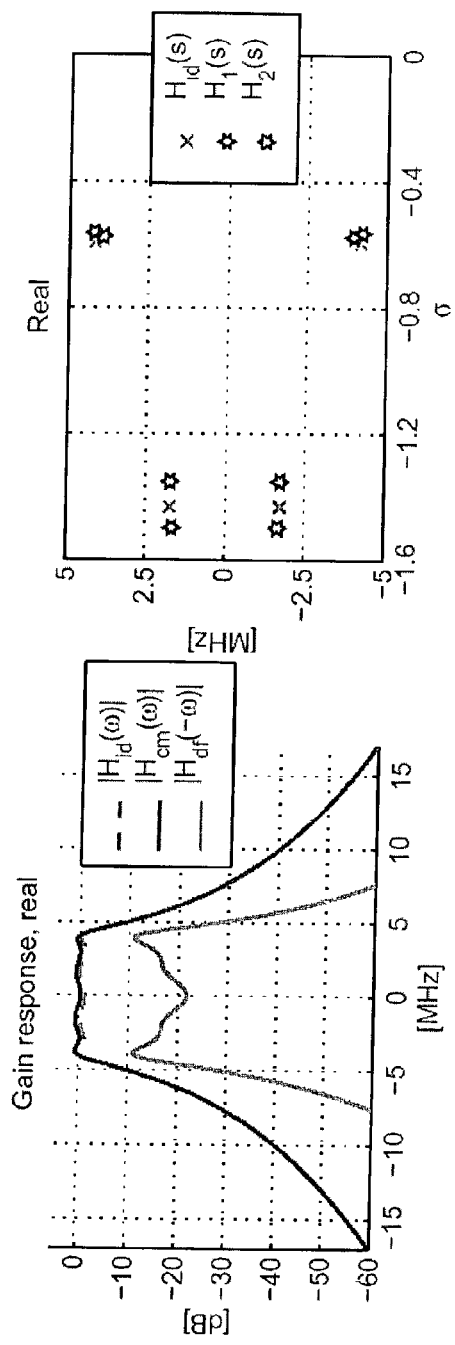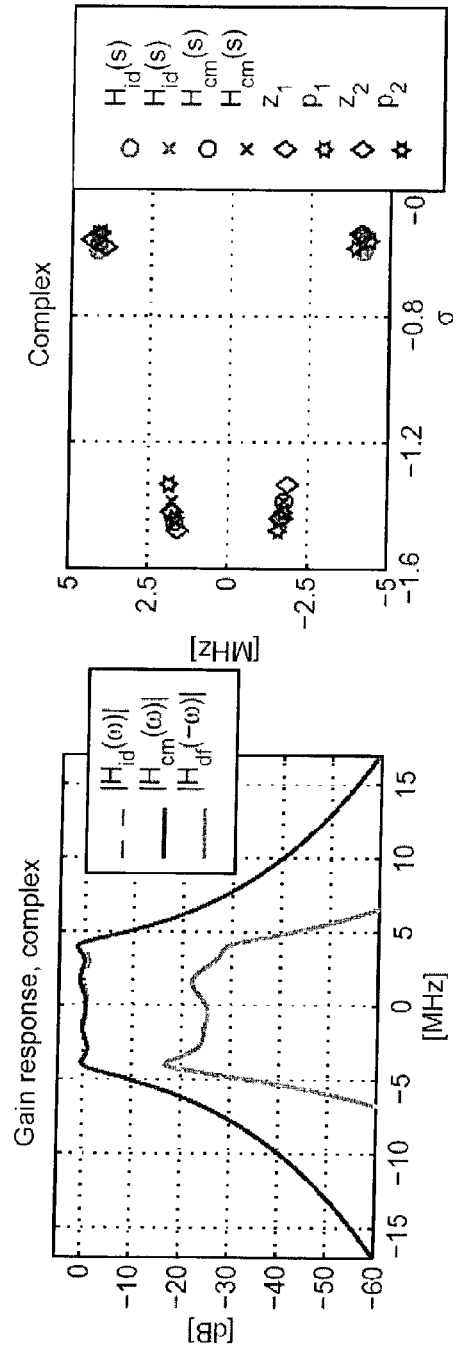
FIGURE 36
FIGURE 37
FIGURE 38
FIGURE 39

POLYPHASE FILTER WITH LOW-PASS RESPONSE

§ 0. PRIORITY CLAIM

Benefit is claimed, under 35 U.S.C. § 119(e) (1), to the filing date of: provisional patent application Ser. No. 60/368,700, entitled "COMPLEX LOW-PASS FILTERS—A NOVEL APPROACH TO DIRECT-CONVERSION TRANSCEIVERS", filed on Mar. 29, 2002 and listing Jack P. Glas, Peter Kiss and Vladimir Prodanov as the inventors; and provisional patent application Ser. No. 60/371,939, entitled "POLYPHASE FILTER WITH LOW-PASS RESPONSE", filed on Apr. 11, 2002 and listing Vladimir Prodanov, Peter Kiss and Mihai Banu as inventors, for any inventions disclosed in the manner provided by 35 U.S.C. § 112, ¶ 1. These provisional applications are expressly incorporated herein by reference.

§ 1. BACKGROUND

§ 1.1 Field of the Invention

The present invention concerns signal processing. More specifically, the present invention concerns a low-pass filter that may be used in direct conversion transceivers.

§ 1.2 Related Art

Data communications and signal processing are introduced in § 1.2.1 below. Then, filters, including mathematical representations and different types of filters, their uses and their limitations are introduced in § 1.2.2.

§ 1.2.1 Signal Processing

Voice signals (referred to as v(t)) may be measured in the time domain. For analysis purposes sometimes it is more convenient to consider voice signals in the frequency domain. The voice signal in the frequency domain is represented by $V(\omega)$. (Following convention, lower case letters are used when describing a signal in the time domain, and capital letters are used when describing a signal in the frequency domain.) The time domain representation and the frequency domain representation of the same signal look different from each other, but they express the same information.

Through a processing of "mixing", in the time domain, it is possible to "shift", in the frequency domain, the voice signal $V(\omega)$, from dc ($\omega=0$), to anywhere along the frequency axis. In order to shift the voice signal, $V(\omega)$, along the frequency axis, an oscillating signal $x(t)=A \cos(\omega_0 t)$, is mixed with the voice signal, v(t). The amplitude of x(t) is "A", and the frequency of x(t) is $\omega_0$. The oscillating signal, $X(\omega)$, in the frequency domain, comprises two dirac impulse functions located at the frequency of x(t), i.e., $\omega_0$ and $-\omega_0$.

Mixing v(t) and x(t) in the time domain generates a mixed signal b(t). In the frequency domain, $B(\omega)$ appears to be two $V(\omega)$ functions, shifted in the positive and negative directions so that the two $V(\omega)$ functions are centered around the positions of the dirac impulse functions. That is, one instance of $V(\omega)$ is centered at $\omega_0$ and another instance is centered at $-\omega_0$. This shifted signal is called $B(\omega)$.

Using the above described technique with a second voice signal (referred to as $M(\omega)$ and a second signal (referred to as $G(\omega)$ oscillating at a different frequency, it is possible to transmit both of the voice signals over one transmission medium using different frequency bands (e.g., radio). When m(t) and g(t) are mixed in the time domain, $M(\omega)$ is shifted to the left and the right to center around $\omega_1$ and $-\omega_1$. This shifted signal is called $K(\omega)$.

The time domain signals k(t) and b(t) can be added together, and in ideal conditions, l(t) would be obtained. In the frequency domain, $L(\omega)$ comprises the two voice signals lying in separate frequency bands and not interfering with each other. This combined signal l(t) can then be transmitted over a single transmission medium. Once l(t) is received by a device, the device can use a filter to isolate the channel (and therefore the signal) that is desired. A general discussion on the background of filters is given in the next section.

§ 1.2.2 Filters and Their Use in Transceivers

Filters have many uses in the field of signal processing. For example, as known in the art and just described in § 1.2.1 above, multiple channels of data can be mixed together and transmitted over a single transmission medium using one or some of a plurality of different processing techniques. In some situations (e.g., when channels are separated into frequency ($\omega$) bands), filters may be used (e.g., at a receiver) to extract a desired channel by suppressing the other channels. The filtering operation also helps to suppress noise that may have been introduced into the signal.

Three basic categories of filters include high-pass filters, which pass channels in high frequencies; low-pass filters, which pass channels in low frequencies; and band-pass filters, which pass a specific frequency band (e.g., to isolate one channel of information).

A filter's characteristics or frequency response can be modeled mathematically, through its transfer function, H:

$$H = \frac{Output}{Input} = \frac{B(\omega)}{A(\omega)}$$

The root of the dominator, $A(\omega)$, of the transfer function are called the "poles" of a filter and the root of the numerator, $B(\omega)$, of the transfer function are called the "zeros" of a filter.

Filters may be real or complex. Real filters have poles that are symmetrical with respect to dc ($\omega=0$), i.e., having one pole at $\omega=a$, and another pole at $\omega=-a$. Complex filters may have effective poles that are not necessarily symmetrical with respect to dc. The position of the poles is one factor that determines the frequencies a filter will pass. As mentioned earlier, low-pass filters pass frequencies around dc. Therefore, using the symmetric nature of real filters, a low-pass filter can be implemented using symmetric poles located close to dc. One use of low-pass filters is in direct conversion transceivers, as will be discussed further below.

As mentioned earlier, multiple channels of data can share a single transmission medium, but a receiver (e.g., a radio) may desire data from one channel. Therefore, to isolate the desired channel for processing, transceivers typically perform at least three operations on the received signal: (1) the undesired channels are filtered out; (2) the desired channel is "shifted" to dc, where it can be processed; and (3) the signal is amplified. The order of the operations depends on the design of the receiver. Shifting a signal may be accomplished by mixing the signal with a local oscillator signal.

In superheterodyne transceivers, the input signal (e.g., a Radio Frequency ("RF") signal) is amplified and filtered. Then, the filtered RF signal is shifted to an intermediate frequency ("IF") where it is passed through a highly selective filter and substantially amplified before it is shifted to dc for processing.

Direct conversion transceivers use techniques to avoid having to use an IF, thereby saving power, cost and allowing for a smaller physical design for some applications (like GSM). A part of an exemplary direct conversion receiver is illustrated in FIG. 1. The receiver 100 receives an input signal, $x_{rf}$, and includes two quadrature related (separated in phase by 90°) local oscillator signals, $lo_1$ ("I"), $lo_2$ ("Q"), two mixers 105, 110, and two real low-pass filters, 115, 120.

An exemplary operation of the direct conversion receiver 100, which uses real low-pass filters, will now be discussed, As shown in FIG. 1, an input signal, $x_{rf}$ is applied to two paths. The mixers 105, 110 mix the input signal $x_{rf}$ with two local oscillator signals that are quadrature in nature ($lo_1$ (I) and $lo_2$ (Q)). The two resulting signals, $x_1$ and $x_2$, are separately filtered by two different low-pass filters 115, 120. Then, the filtered signals, $y_1$ and $y_2$, are processed to reform the transmitted signal in the known manner.

The two quadrature paths, I and Q, allow the direct conversion receiver to avoid having to use an IF. The following discussion describes, in theoretical terms, why a direct conversion receiver does not need to use an IF. When two local oscillator signals in a forward-quadrature relationship are added in the frequency domain (e.g., using the complex operator "j": $X_c(\omega) = F\{x_1 + jx_2\}$), the two dirac impulse functions on the negative side cancel each other out, and the dirac impulse functions on the positive side add together to form a dirac impulse function with a doubled amplitude. Note that this combination results in a single dirac impulse function. Therefore a signal mixed with the single dirac impulse function is shifted in one direction. Using a reverse-quadrature pair if is possible to shift a received signal in the opposite direction. Direct conversion transceivers use this concept to shift the received signal to dc.

FIGS. 2 and 3 illustrate ideal direct conversion using the single dirac impulse function. FIG. 2 illustrates an exemplary received signal, RF($\omega$). The top graph of FIG. 3 illustrates the effective local oscillator signal $LO_c(\omega)$ of a direct conversion receiver in ideal conditions, i.e., a single dirac impulse function. The lower graph of FIG. 3 shows the original signal, RF($\omega$), shifted to center around the dirac impulse function.

Unfortunately, the characteristics of direct conversion transceivers are not ideal. DC offsets, even-order distortion, flicker noise, LO leakage, I/Q imbalance, and imperfect filtering in direct conversion transceivers are some known sources of such non-ideal behavior. I/Q imbalance is introduced below in § 1.2.2.1. Leakage distortion, due to mismatches in the components used in the real filters, is introduced in § 1.2.2.2 below.

§ 1.2.2.1 I/Q Imbalance

Referring back to the direct conversion receiver of FIG. 1, slight differences in the I/Q relationship of $LO_1$ and $LO_2$, and I and Q signals that are not exactly in quadrature cause I/Q imbalance. This I/Q imbalance is illustrated by a small dirac impulse function at $\omega_{lo}$ in the top graph of FIG. 4—the larger dirac impulse function at $-\omega_{lo}$ is desired. For example, in the ideal case when two local oscillator functions are added together, the dirac impulse functions on the positive frequency side should cancel out perfectly, leaving just one dirac impulse function. However, I/Q imbalance causes an imperfect cancellation creating a small unwanted dirac impulse function on the positive frequency side. As illustrated in the lower half of FIG. 4, this small dirac function causes a small portion of the original signal to be shifted in the opposite direction, and a small amount of overlapping to occur at dc, creating distortions.

§ 1.2.2.2 Leakage Distortion—Mismatched Real Filters

Filter (component) mismatches also cause problems. If the components of filters 1215, 1220 are not perfectly matched, (i.e., if the transfer functions do not match—$H_1(\omega)$ $H_2(\omega)$), then a non-zero transfer function, $H_{df}(\omega)$, contributes to a leaked (undesired or difference) output component. Even when the filter components are fabricated at the same time and on the same integrated chip, component mismatch of 0.2% to 0.5% or even larger may still occur. A parallel model of an imperfect low-pass filtering operation is illustrated in FIG. 5. The top branch represents the common component, $h_{cm}$, of $H_1(\omega)$ and $H_2(\omega)$, which produces the desired output. The bottom branch represents the difference component, $h_{df}$, between $H_1(\omega)$ and $H_2(\omega)$, which produces the leaked signal.

FIGS. 6–9 illustrate an imperfect low-pass filtering operation (even assuming no I/Q imbalance in the LO signals). FIG. 6 illustrates an exemplary received signal. In FIG. 7, ideal I/Q mixing is assumed, and the signals are only shifted in one direction. In FIG. 8, the shifted signals are filtered by imperfect real filters. The results are the desired signal illustrated in the top graph, and a leaked signal illustrated in the bottom graph. As shown in the imperfect filtering model of FIG. 5, the two resulting signals are added together (in a complex sense). FIG. 9 illustrates the distorted output signal of an imperfect low-pass filtering operation.

In view of the above discussion, there is a desire for reducing the consequences (e.g., leaked signal) associated with mismatched real filters. More specifically, there is a desire for methods and apparatus that can perform low-pass filtering that is less sensitive to mismatches in filter component values.

§ 2. SUMMARY OF THE INVENTION

The present invention provides a complex low-pass filter that reduces the influence of component mismatch. The filter includes a first filter section for effecting a first single pole transfer function and a second filter section for effecting a second single pole transfer function, where the first and the second single pole transfer functions collectively define a conjugate pair of poles. In higher order low-pass filters, an optimal cascade order may follow a shoestring pattern.

§ 3. BRIEF DESCRIPTION OF THE DRAWINGS

FIG. 20 illustrates a model for cascading imperfect complex poles in accordance with a retirement of the present invention.

FIGS. 21–24 collectively illustrate the frequency responses for a cascade of four single complex poles.

Figures 25, 26:
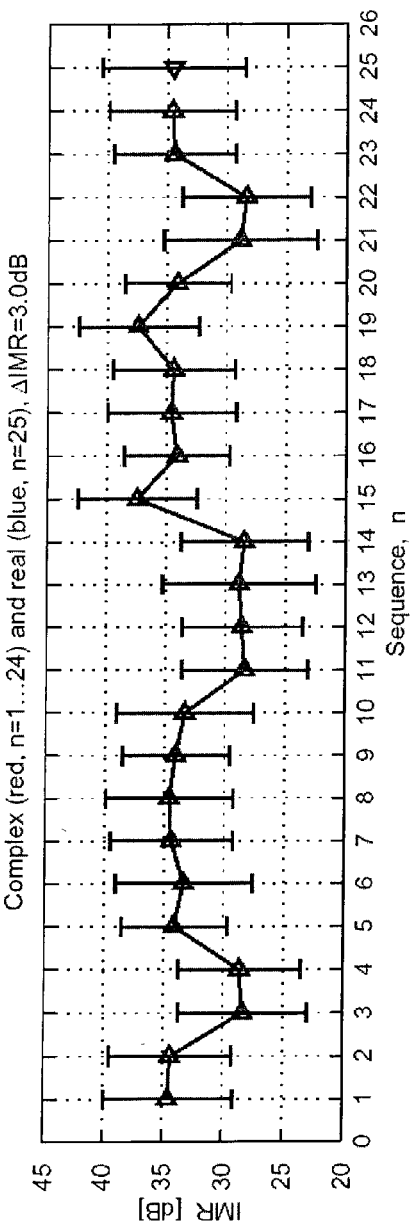

FIG. 25 tabulates 24 potential configurations that the four single complex poles of a fourth order complex filter can take.

FIG. 26 illustrates the behavior of the 24 configurations of a fourth order complex low-pass filter and a fourth order real low-pass filter.

Figure 28:
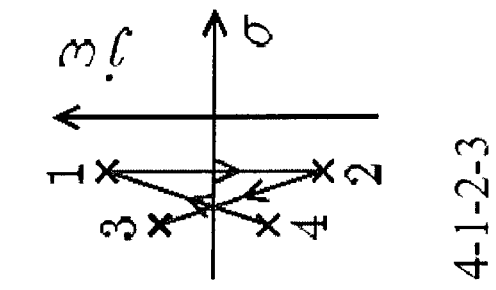
Figure 27:
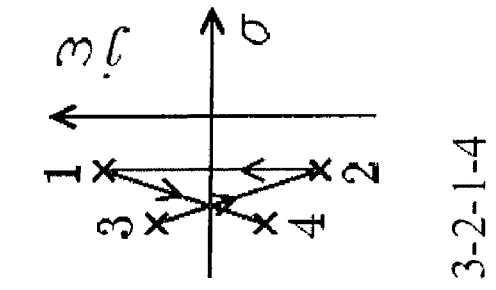

FIGS. 27 and 28 illustrate two exemplary "shoestring" patterns of a cascade order for a fourth order complex low-pass filter implemented in accordance with the invention.

Figure 30:
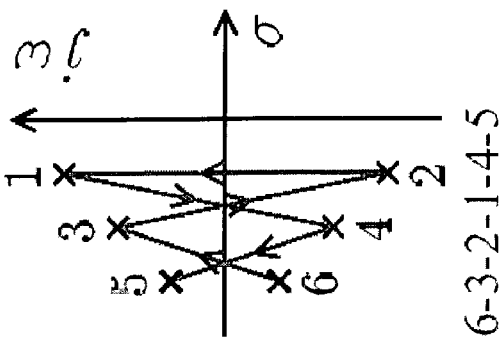
Figure 29:
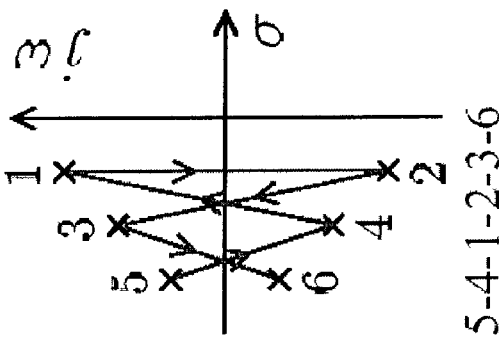

FIGS. 29 and 30 illustrate two exemplary "shoestring" patterns of a cascade order for a sixth order complex low-pass filter implemented in accordance with the invention.

Figure 31:
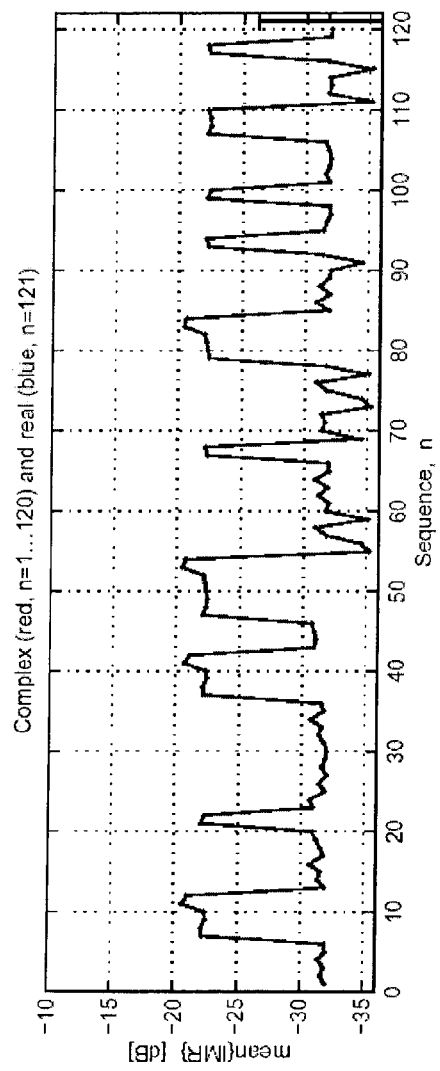

FIG. 31 illustrates the mean IMR for all the sequences of a fifth order complex low-pass filter implemented in accordance with the invention.

Figure 32:
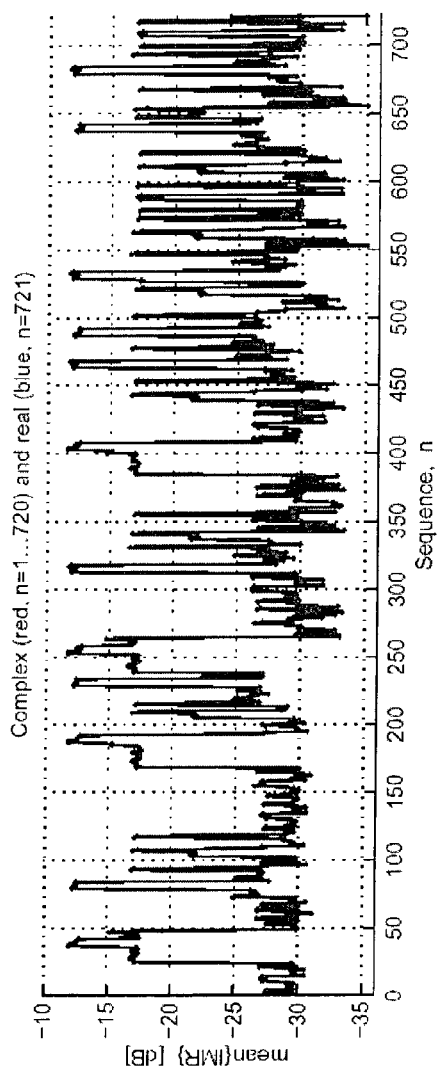

FIG. 32 illustrates the mean IMR for all the sequences of a sixth order complex low-pass filter implemented in accordance with the invention.

Figure 33:
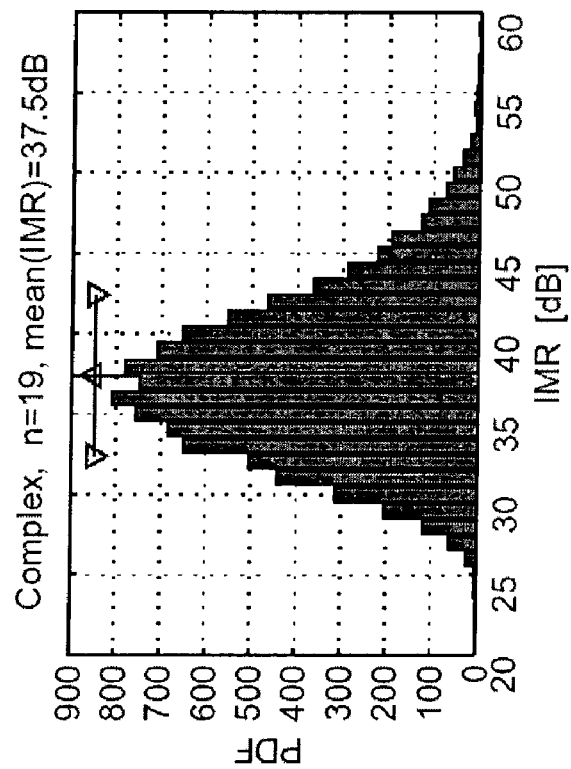

FIG. 33 illustrates an IMR histogram of a fourth order complex low-pass filter implemented in accordance with the invention, using configuration number 19 of FIG. 25.

Figure 34:
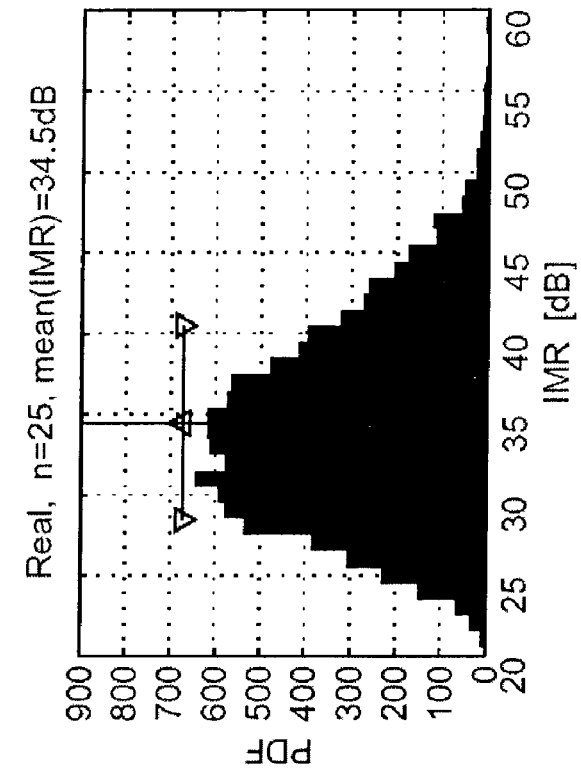

FIG. 34 illustrates an IMR histogram of a fourth order real low-pass filter.

Figures 35A, 35B:
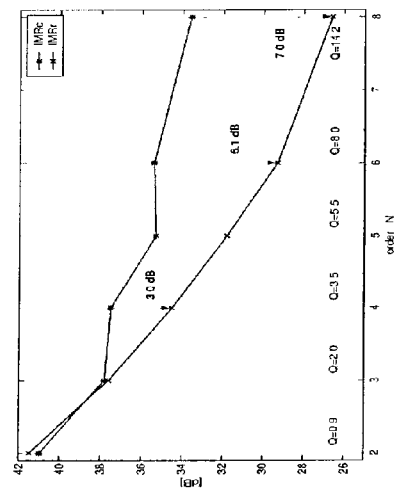

FIG. 35*a* is a table and FIG. 35*b* is a graph, both illustrating the increasing improvements of a complex low-pass filter, made in accordance with the present inventory, over a real low-pass filter as the order, N, and quality factor, Q, of a filter increase.

FIG. 36 illustrates the frequency response of a fourth order real low-pass filter.

FIG. 37 illustrates the pole-zero constellation of the fourth order real low-pass filter whose characteristics are illustrated in FIG. 36.

FIG. 38 illustrates the frequency response of a fourth order complex low-pass filter, implemented in accordance with the invention.

FIG. 39 illustrates the pole-zero constellation of the fourth order complex low-pass filter whose characteristics are illustrated in FIG. 38.

Figure 40:
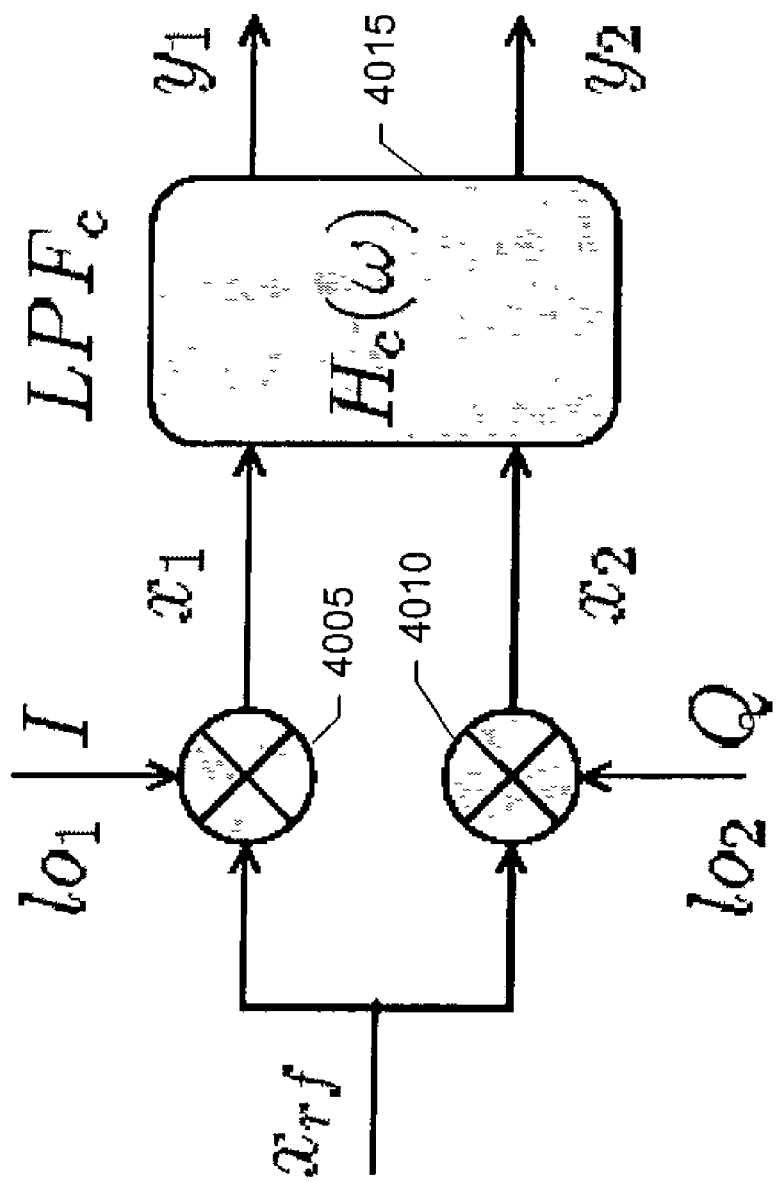

FIG. 40 is a quadrature direct conversion receiver using a complex low-pass filter of the present invention, instead of two real filters.

§ 4. DETAILED DESCRIPTION OF THE INVENTION

The present invention involves novel methods and apparatus for a polyphase complex low-pass filtering. The following description is presented to enable one skilled in the art to make and use the invention, and is provided in the context of particular embodiments and methods. Various modifications to the disclosed embodiments and methods will be apparent to those skilled in the art, and the general principles set forth below may be applied to other embodiments, methods and applications. Thus, the present invention is not intended to be limited to the embodiments and methods shown and the inventors regard their invention as the following disclosed methods, apparatus and materials and any other patentable subject matter to the extent that they are patentable.

§ 4.1 Exemplary Complex Low-Pass Filter

Figure 10:
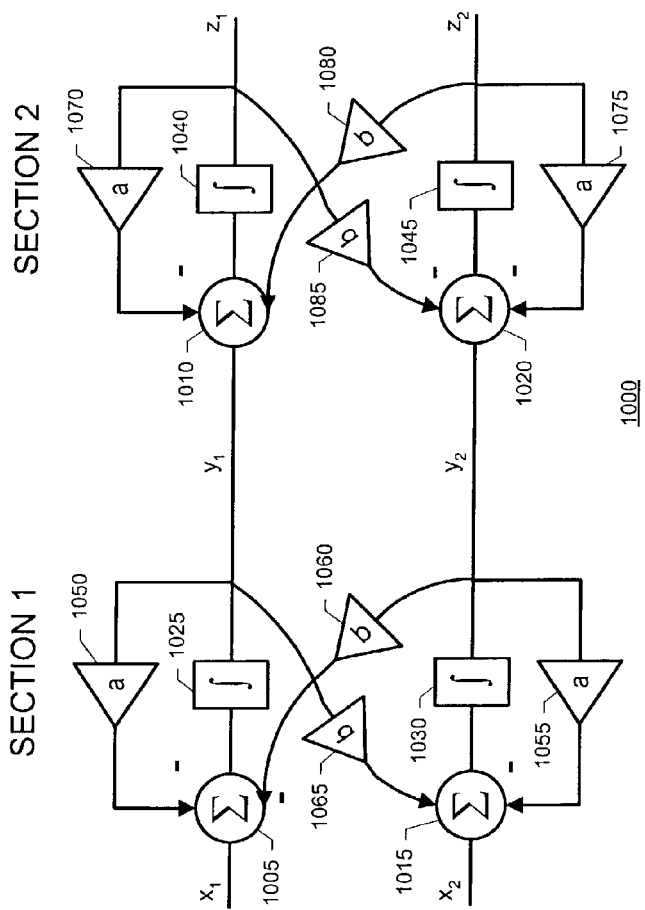
FIG. 10 is an exemplary embodiment of a second order complex low-pass filter, implemented in accordance with the present invention.

FIG. 10 illustrates an exemplary second order complex low-pass filter 1000 implemented in accordance with the present invention. Each section, 1 and 2, implements a complex pole. Complex low-pass filter 1000 includes four (4) adders (or "mixers") 1005, 1010, 1015, 1020, four (4) integrators 1025, 1030, 1040, 1045, and eight (8) gain stages (referred to as "amplifiers" in the specification below without loss of generality) 1050, 1055, 1060, 1065, 1070, 1075, 1080, 1085. Inputs $x_1$ and $x_2$ are in quadrature, and are applied to adders 1005 and 1015, respectively, of the first section. The output $y_1$ of the first integrator 1025 is fed back, after amplification by an amplifier 1050, as a negative input to the first adder 1005, and is fed, after amplification by an amplifier 1065 as an input to the second adder 1015. Similarly, the output $y_2$ of the second integrator 1030 is fed back, after amplification by an amplifier 1055, as negative input to the second adder 1015, and is fed, after amplification by an amplifier 1060, as an input to the first adder 1005. The outputs of the adders 1005 and 1015 are provided as an input to integrators 1025 and 1030, respectively. Further, the output $y_1$ of the first integrator 1025 is provided to the adder 1010 of the second section, and the output $y_2$ of the second integrator 1030 is provided to the adder 1020 of the second section. The components of the second section are coupled in a similar manner, except that the signs of the "crossing" amplifiers 1080 and 1085 are reversed.

Figure 11:
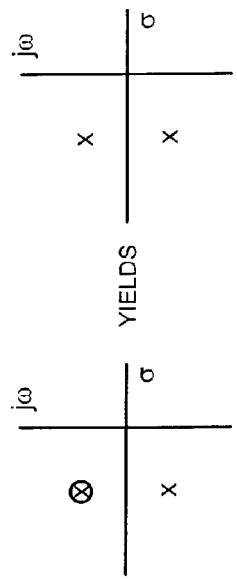
FIG. 11 illustrates the pole-zero constellation for each stage of the complex low-pass filter of FIG. 10, and the resulting pole-zero constellation of the filter.

Graphs 1 and 2 of FIG. 11 illustrate the pole-zero constellation for sections 1 and 2 of the filter 1000, respectively. As shown in graph 1 of FIG. 11, section 1 of complex low-pass filter 1000 implements an effective single complex pole that lies in the positive jω region. The complex low-pass filter 1000 models a pair of real low-pass filters. Therefore, a second pole that is symmetric with the first pole, with respect to dc (and therefore defines, with the first pole, a complex conjugate pair), is implemented by section 2 of the filter 1000. As shown in graph 2 of FIG. 11, section 2 of complex low-pass filter 1000 implements an effective single complex pole that lies in a negative jω region.

To reiterate, the difference between sections 1 and 2 of the filter 1000 of FIG. 10 is that the amplifiers in section 1 with the "b" and "−b" values 1065, 1060 are switched in section 2. This places the pole of section 2 in the negative jω region. The values of the amplifiers and the components that make up the adders and integrators are implemented with similar components so that the two poles are symmetric with respect to dc.

When the pole-zero constellations of the two sections, 1 and 2, of complex low-pass filter 1000 are combined, the effective result is two poles that are symmetric with respect to dc, shown in graph 3 of FIG. 11. Actually, each effective pole of graph 3 of FIG. 11 is two poles and one zero. In this way, the exemplary complex low-pass filter 1000 of FIG. 10 models a pair of real low-pass filters. As will be discussed further below, the complex low-pass filters of the present invention that model real low-pass filters are less sensitive to distortions related to component mismatch.

Figure 12:
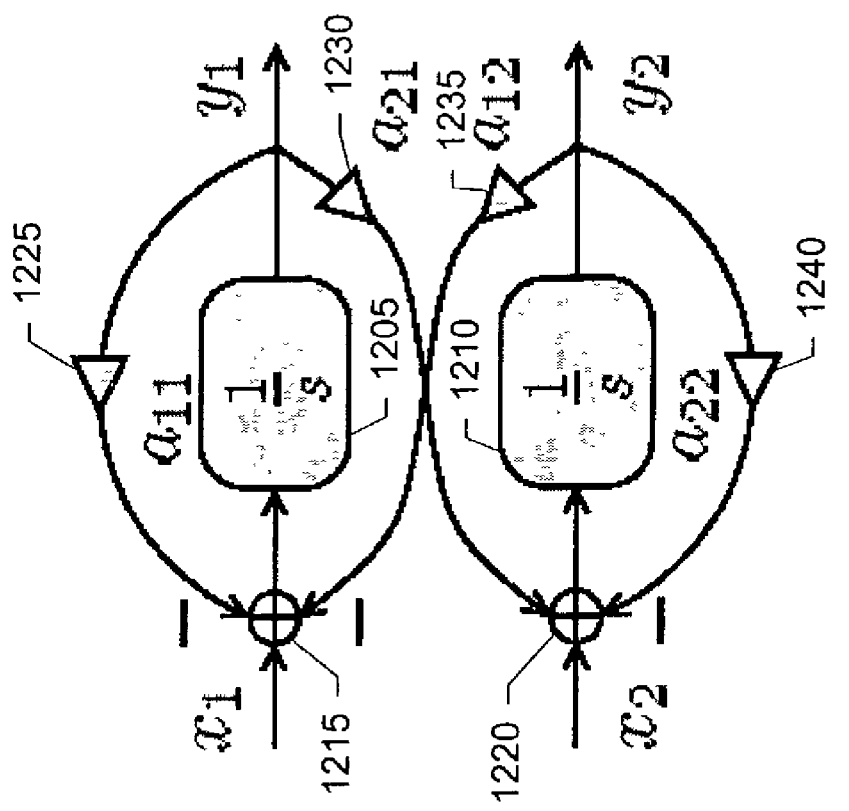
FIG. 12 is an exemplary implementation of a single complex pole portion of the present invention.

A section of the filter 1000 of the present invention, namely a filter having a single complex pole in a positive jω region, has been discussed in the article W. M. Snelgrove and A. S. Sedra, "State-space synthesis of complex analog filters," in *Proc. of the European Conference on Circuit Theory and Design*, 1981, pp. 420–424 (incorporated herein by reference and hereafter referred to as "the Snelgrove article"). The Snelgrove article discusses placing a zero on the negative pole of a symmetric real filter, thereby creating a first order filter that behaves as if it has a single complex pole. FIG. 12 illustrates an exemplary single complex pole filter 1200. This exemplary single complex pole filter 1200 can be effectively implemented using two integrators 1205, 1210, two adders 1215 and 1220, and four amplifiers 1225, 1230, 1235, 1240. The components of the single complex pole filter 1200 are coupled in a similar manner as section 1 of the complex low-pass filter 1000 of FIG. 10.

Figure 13:
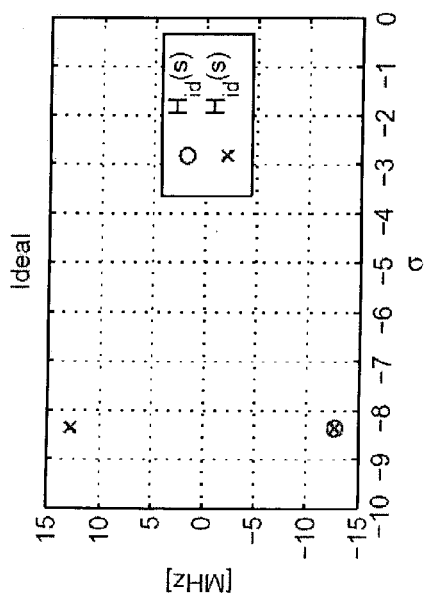
FIG. 13 illustrates the pole-zero constellation of an ideal first order filter.
Figure 14:
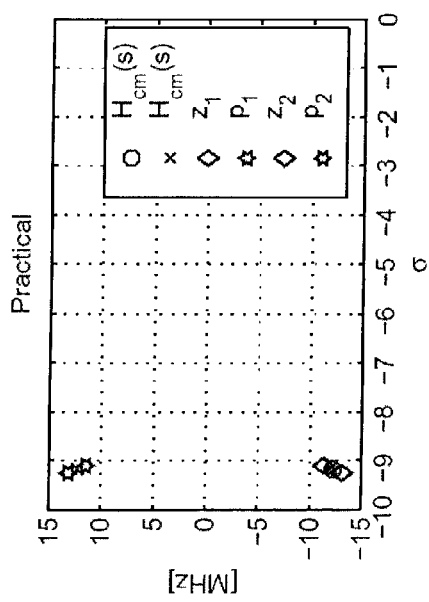
FIG. 14 illustrates the pole-zero constellation of a practical first order filter with 5% component mismatch error.

In an ideal implementation of a single complex pole (i.e., $a_{11}=a_{22}=a$ and $a_{12}=a_{21}=b$) the zero will be directly on one of the poles, completely canceling out the effect of that pole. This is illustrated in FIG. 13. Unfortunately due to circuit imperfections, the pole-zero cancellation is not complete. For example, a simulation of an imperfect single complex pole, compared with the ideal single complex pole showed that the poles and zeros lie in clusters around their ideal locations. In the non-ideal (practical) case, the coefficients $a_{11}$, $a_{22}$, $a_{12}$ and $a_{21}$ of FIG. 12, are realized by the implementation of various circuit elements (e.g., passive RC, active RC, etc.), and these various elements will have slight variations from each other. In the simulation, these slight variations may produce a normally-distributed error with a 1% variance. The errors are assumed to be uncorrelated. Thus, the magnitude and distribution of the errors are tailored to the specifics of the implementation. FIG. 14 illustrates the simulated imperfect single complex pole with 5% error. FIG. 14 shows that as the error increases, the poles $p_1$ and $p_2$ of the filter move away from the ideal position and lead to a non-zero difference value $H_{df}(s)$. However, the pole-zero cancellation within the common value, $H_{cm}(s)$ occurs to a large extent.

Figure 15:
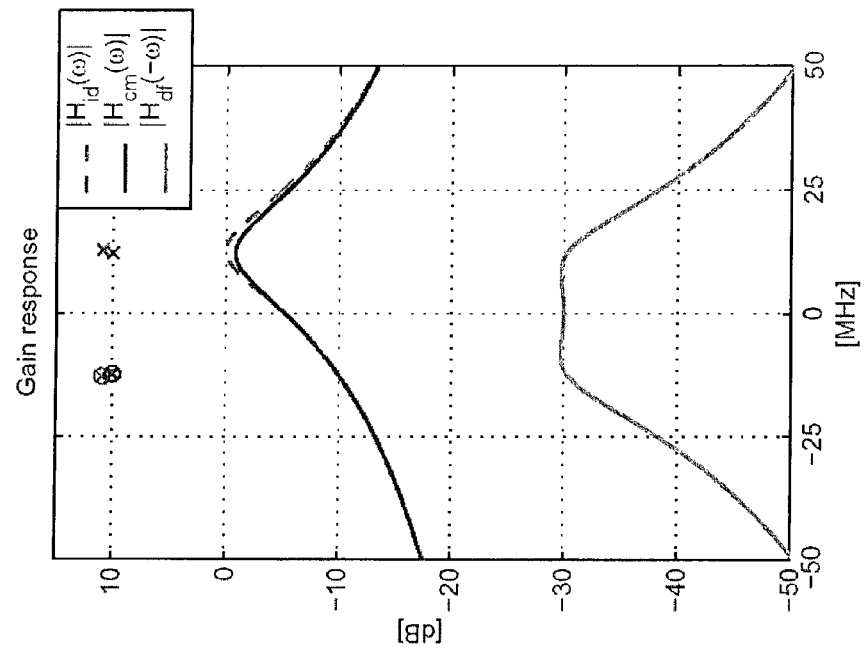
FIG. 15 illustrates the frequency response of an ideal first order filter versus a practical first order filter.

FIG. 15 illustrates the frequency responses of the ideal case (dashed lines) and the practical (non-ideal) case (solid lines). The practical (non-ideal) case has been separated into its common value and its difference value. FIG. 15 shows the slight variations that occur in a practical application of the exemplary single complex pole filter 1200 of FIG. 12.

Such a single complex poles technique has been used in some complex band-pass filters. Such complex band-pass filters have been used in IF transceivers. While symmetric poles may be acceptable and in some situations desired when implementing a real low-pass filter, pole symmetry may be a hindrance in band-pass implementations because the "negative" poles pass undesired signals or noise.

Figure 17:
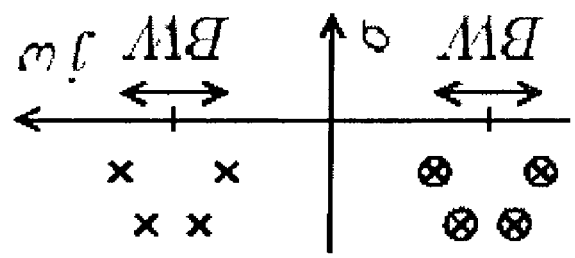
FIG. 17 illustrates the pole-zero constellation of the complex band-pass filter whose characteristics are illustrated in of FIG. 16.
Figure 16:
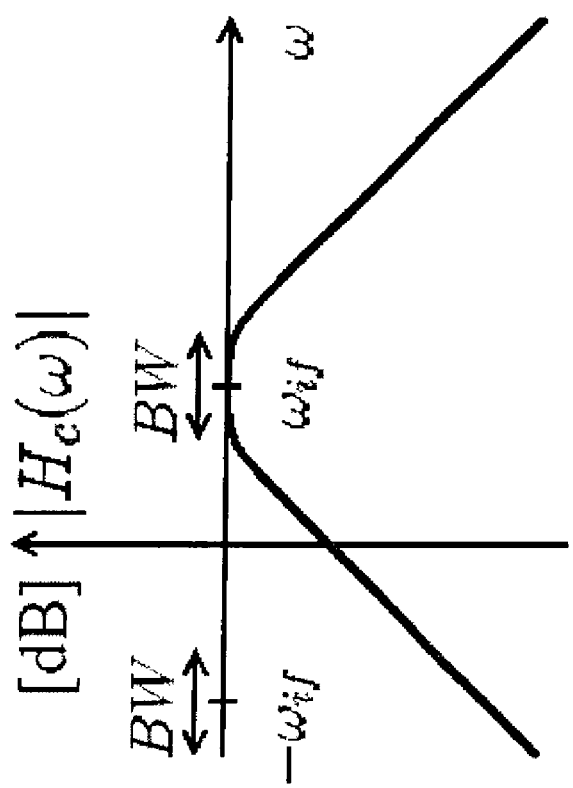
FIG. 16 illustrates the frequency response of a fourth order complex band-pass filter.

FIG. 16 illustrates the frequency response of a fourth order (four effective poles) complex band-pass filter. The filter is centered around intermediate frequency, $\omega_{if}$, thereby passing signals that lie in a frequency band centered around $\omega_{if}$. FIG. 17 illustrates the pole-zero constellation for the fourth order complex band-pass filter. As FIG. 17 illustrates, eight (8) poles are arranged in a symmetric formation around dc. The four negative poles are cancelled by zeros, making the filter behave as if it has four positive complex poles.

The band-pass filters of the Snelgrove article have positive single complex poles. With a complex low-pass filter made in accordance with the present invention, negative complex poles are also desired. Such negative complex poles are provided by providing a companion section in which the b, −b amplification is inverted.

A refinement of the present invention, in which single complex poles are cascaded in a preferred way to form higher order filters, is described in § 4.2 below.

§ 4.2 Cascade of Filters

Figure 1:
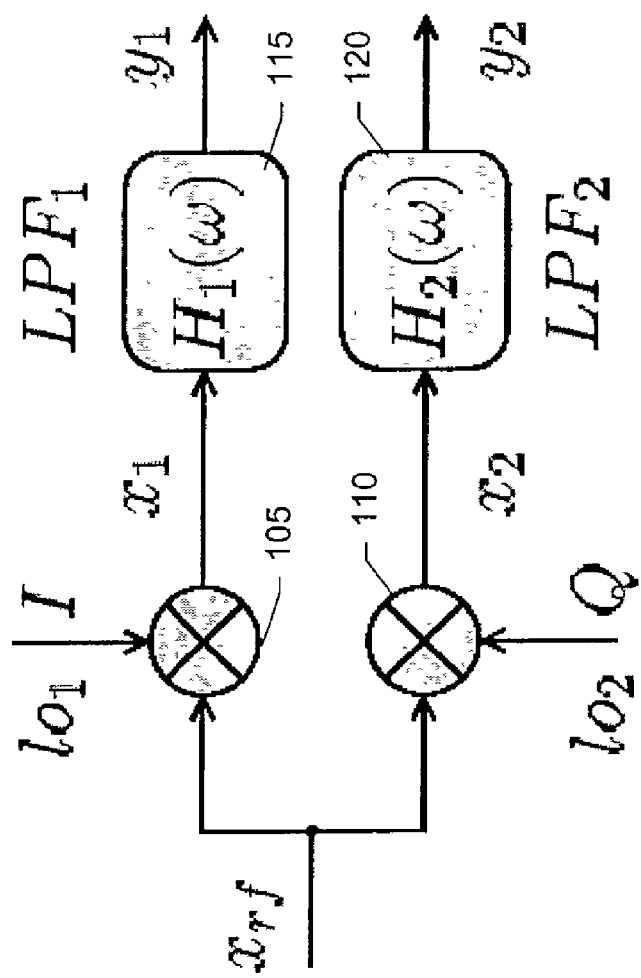
FIG. 1 illustrates a quadrature direct conversion receiver that uses two real low-pass filters.
Figure 2:
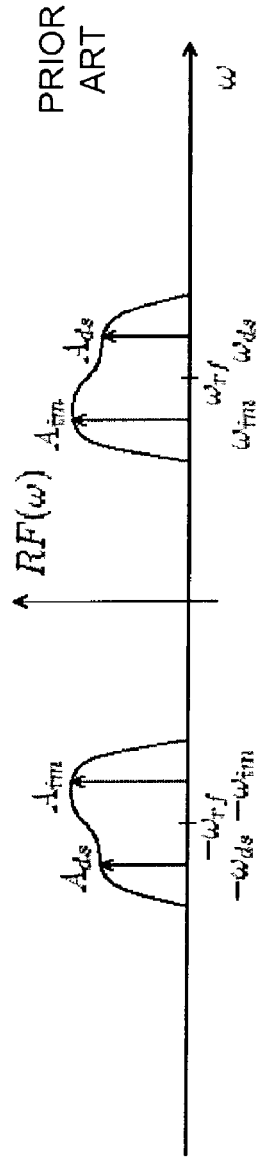
FIG. 2 illustrates an exemplary rf signal.
Figure 3:
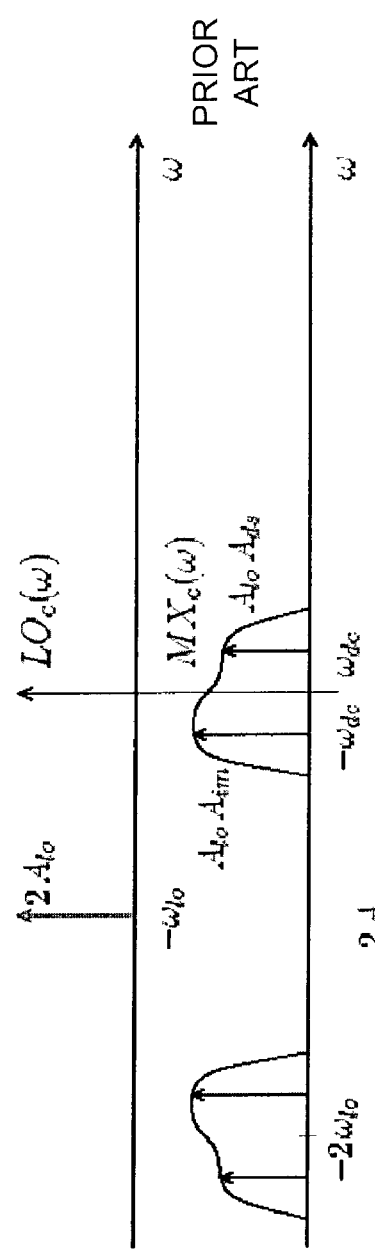
FIG. 3 illustrates ideal quadrature mixing.
Figure 4:
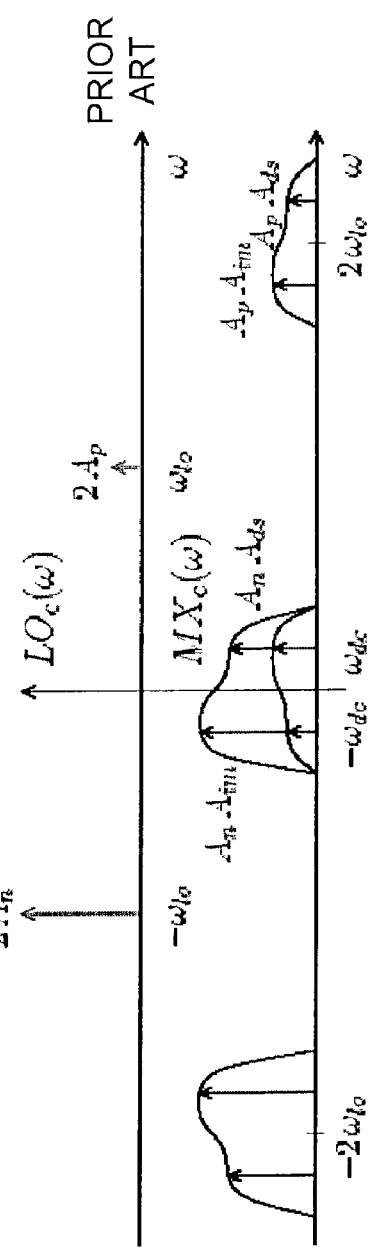
FIG. 4 illustrates practical quadrature mixing with I/Q imbalance in the LO signals.
Figure 5:
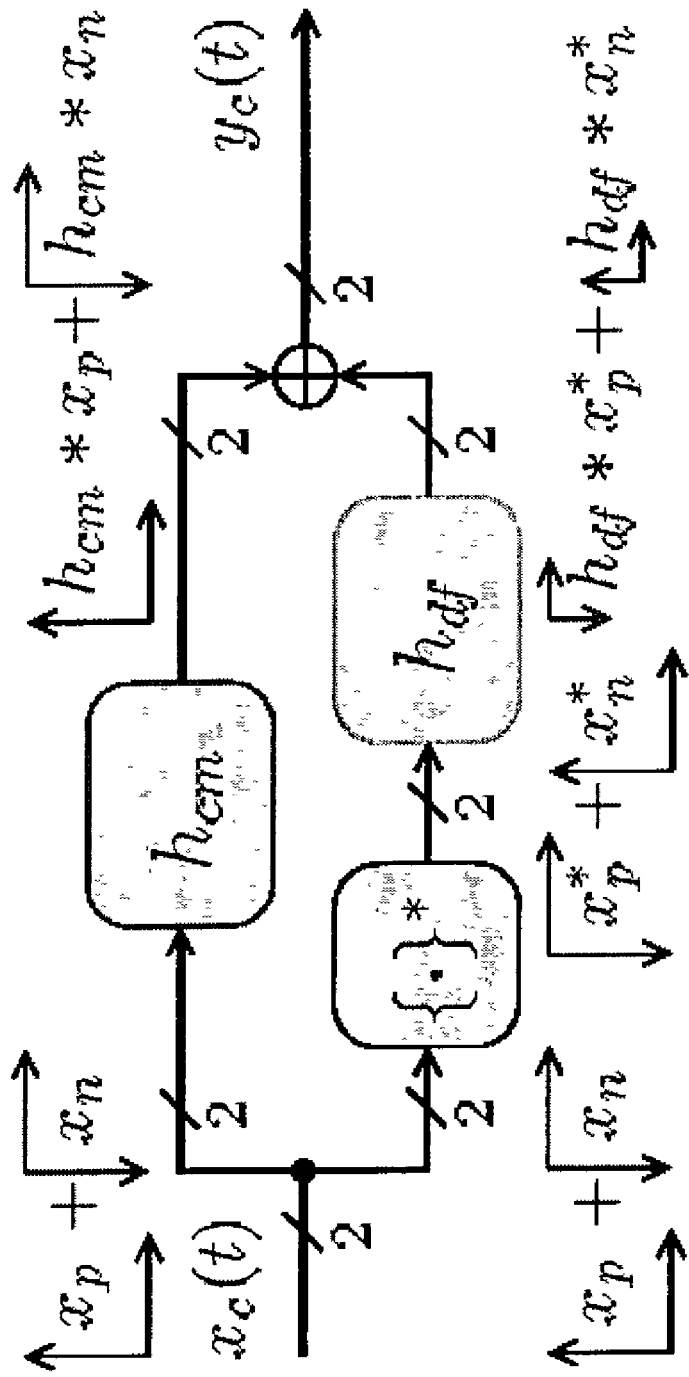
FIG. 5 illustrates a parallel model of an imperfect low-pass filtering operation.
Figure 6:
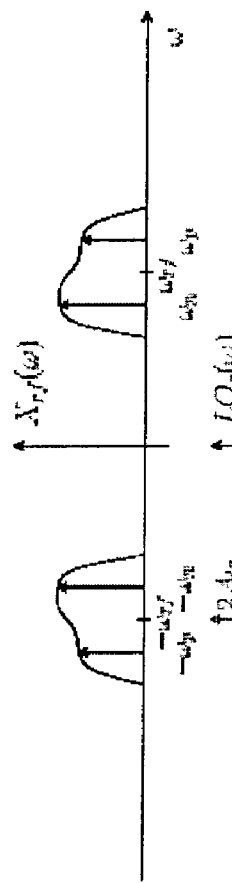
FIG. 6 illustrates an exemplary rf signal.
Figure 7:
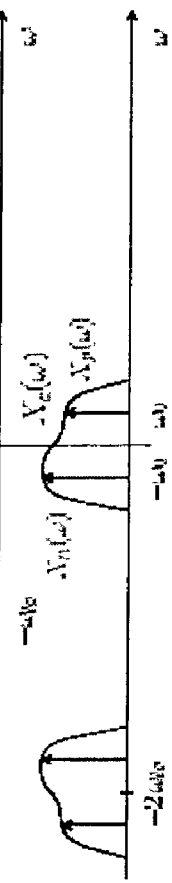
FIG. 7 illustrates ideal quadrature mixing.
Figure 8:
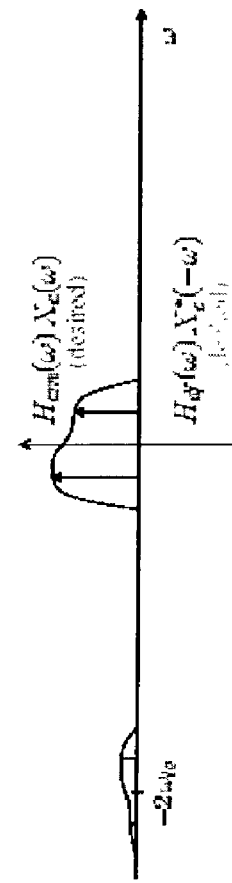
FIG. 8 illustrates the desired and leaked output signal components of the rf signal due to mismatched real filters.
Figure 9:
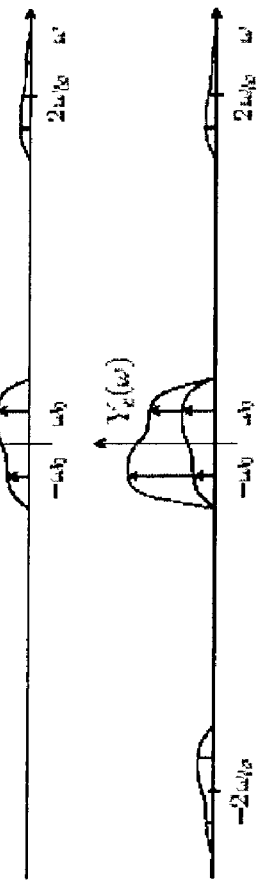
FIG. 9 illustrates the distorted output signal that results when the desired and leaked signals of FIG. 29 are combined.

The concepts of the present invention can be applied to higher order filters by cascading single complex poles. A refinement of the present invention orders the cascade in an optimal way. When a pair of real low-pass filters are used, as in FIG. 1, the poles of the low-pass filter may be placed in any order because there is no interaction between the individual I and Q paths until the final (or "global") output. On the other hand, with a cascade of complex poles, the desired (common) and undesired (leaked) signal components interact at the output of every section (or "local output"). Therefore the sequence in which the poles are cascaded affects the performance of a filter.

Figure 19:
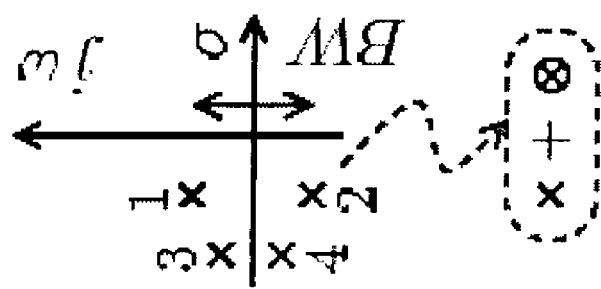
FIG. 19 illustrates the pole-zero constellation of the complex low-pass filter whose characteristics are illustrated in FIG. 18.
Figure 18:
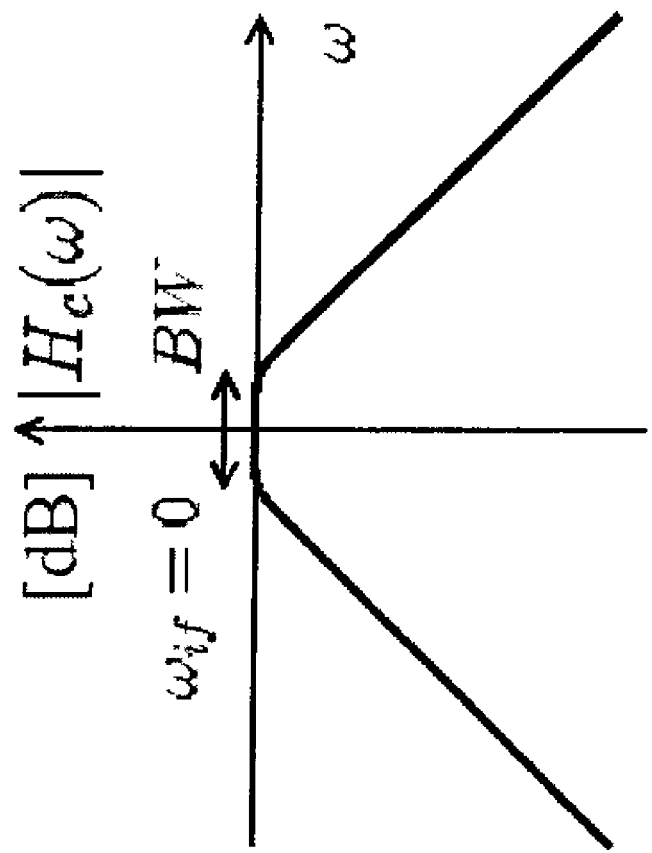
FIG. 18 illustrates the frequency response of a fourth order complex low-pass filter implemented in accordance with the present invention.

FIG. 18 illustrates the frequency response of a fourth order (four effective poles) complex low-pass filter implemented in accordance with the present invention. FIG. 19 illustrates the pole-zero constellation for the fourth order complex low-pass filter whose characteristics are illustrated in FIG. 18. In FIG. 19, each of the poles are actually two poles and one zero which, collectively, act as one complex pole. The four (4) complex poles are centered around ω=0 and are symmetric with respect to dc, thereby behaving like a pair of real low-pass filters. As mentioned earlier, using complex filter designs to model real filters lowers the impact of imperfections due to at least filter component mismatch.

The four (4) poles are numbered from 1 to 4 to identify the poles in the different cascading orders that are presented below. In the numbering convention used here, numbering (but not ordering) of the poles starts with the pole closest to σ=0 and in the positive jω region. Then, the poles symmetric pair is numbered. Moving in a more negative σ direction, subsequent pairs of poles are continuously numbered in the same manner.

FIG. 20 models an exemplary fourth order low-pass complex filter 2000 implemented as a cascade of four single complex poles. Each of the four stages processes its complex input and provides desired, $h_{cm}$, and undesired, $h_{df}$, outputs. Part of the undesired signal leaks into the desired signal and vice versa.

To minimize the total leakage at the output of the cascaded complex low-pass filter, the leakage gain seen by the most sensitive poles should be minimized. Usually the more sensitive (i.e., higher quality factor, Q) poles are the ones furthest away from the origin. The pole-zero constellation of FIG. 19 is used as an example of a fourth order complex low-pass filter. (Note that the poles are numbered from 1 to 4.) FIGS. 21–24 collectively illustrate an exemplary pole cascade order (i.e., poles 3, 2, 1, 4). In this configuration, the leakage gain for high-Q poles 1 and 2 are evenly distributed for positive and negative frequencies. Therefore, they have the lowest possible average value (i.e., leakage gain is minimized). Experimental results illustrating the validity of this exemplary configuration will now be described.

§ 4.2.1 The Effect of Cascade Order

There are 24 possible cascade orders for the four (4) poles in the fourth order complex low-pass filter. These 24 possible cascade orders are tabulated in FIG. 25. The 24 different cascade orders are numbered from n=1 to 24. Generally, for a t-order complex filter, there will be t! (t factorial) possible cascade orders.

FIG. 26 illustrates the results of statistical analysis measuring the behavior of 24 possible cascade orders of the fourth-order complex low-pass filter. An average image rejection ratio over a bandwidth (IMR) is measured for each configuration to show how effectively the complex filter passes signal inputs while rejecting image inputs. The $25^{th}$ IMR measurement is for a fourth order real low-pass filter. For each possible cascade order, n, a set of 10,240 normally distributed ($\sigma_n$=1%) random component mismatch states were simulated. The error-bar (mean value and variance) is shown in FIG. 26.

The 24 possible cascade orders can be classified into three categories based on their IMR performance: "best" (n=15 and 19); "mediocre" (n=1, 2, 5–10, 16–18, 20, 23 and 24); and "worst" (n=3, 4, 11–14, 21 and 22). Referring to FIGS. 19 and 25, notice that the best cascade orders (i.e., n=15 and n=19) follow a shoestring pattern from more negative $\sigma$, to less negative $\sigma$, and back to more negative $\sigma$. In other words, the shoestring pattern starts at one of the poles closest to $j\omega$=0 and alternates from negative to positive or positive to negative poles working its way towards $\sigma$=0 and then away from $\sigma$=0. FIGS. 27 and 28 illustrate the shoestring patterns for cascade orders n=15 (3-2-1-4) and n=19 (4-1-2-3), respectively. These cascade orders minimize the leakage gain seen by the most sensitive poles. For odd order filters, the position of the real pole is not critical because its leakage is small and its response is symmetrical to dc.

FIGS. 29 and 30 illustrate shoestring patterns for sixth order complex low-pass filters. The inventors experimentally verified that cascade orders corresponding to the shoestring patterns illustrated in FIGS. 29 and 30 give the best results for sixth order complex low-pass filters. FIGS. 31 and 32 show mean IMR results for the 120 (=5 factorial or 5!) different configurations of a fifth order complex-low-pass filter and the mean IMR results for the 720 (=6 factorial or 6!) different configurations of a sixth order complex low-pass filter, respectively. The peak values occur when the cascade order follows the above-described shoestring pattern configurations.

FIGS. 33 and 34 illustrate the histograms of IMR for configurations 19 (complex low-pass filter) and 25 (real low-pass filter), respectively. Note that the histogram of configuration 19 has a narrower distribution than that of configuration 25 since complex low-pass filters leave less IMR (image rejection) variance than real low-pass filters. This means that in mass integrated circuit production, more fabricated complex low-pass filters will satisfy a certain imposed IMR requirement (e.g., IMR$\geq$40 dB) than real low-pass filters. In other words, higher yield will be achieved.

Referring back to FIG. 26, the IMR results show a 3 dB improvement for the complex low-pass filters with a "best" cascade order versus a fourth order real low-pass filter. Note that these results depend on the quality factor, Q, of the filters. For example the maximum Q value for the previous experiment is $Q_{max}$=3.5. If the $Q_{max}$ is increased to 5.5, the IMR improvement ($\Delta$IMR) becomes 4.1 dB. Therefore, the present invention is more effective as the Q value of the filter increases.

In addition, when the order, N, of the filter increases, the benefits of using complex low-pass filters made in accordance with the present invention over real low-pass filters also increases. One factor that may explain this is higher-order filters are more likely to use high-Q poles to achieve better selectivity. FIG. 35a tabulates and FIG. 35b illustrates the experimental results obtained from 6 different N-order filters. These results show the performance differential increase between complex filters of the present invention and real filters as the order and the Q value of the filters increase. When eighth order complex and real low-pass filters are compared, there is about a 7 dB improvement in the complex low-pass filter. When N equals 2 or 3, the complex low-pass filter performs similarly to a real low-pass filter, possible due to unbalance. However, in practical applications, second order and third order filters are less important.

The simulation results obtained from a fourth order complex low-pass filter constructed in an optimal shoestring pattern of 3-2-1-4 are compared with the results from a fourth order real low-pass filter. The following comparison shows that complex low-pass filters are less sensitive to circuit imperfections than real low-pass filters. More specifically, the frequency responses of two imperfect filters— one a real low-pass filter and the other a complex low-pass filter—are illustrated in FIGS. 36 and 38, respectively. Both filters are fourth order, all-pole filters with a pass-band ripple of $R_p$=1 dB. They are affected by a normally distributed error with $\sigma_n$=5% (Note that this is exaggerated over a practical value of $\sigma_n$=1% for illustrative purposes.), so their poles lay in clusters around the ideal locations. This is illustrated in FIG. 37 for the real low-pass filter and in FIG. 39 for the complex low-pass filter. When IMR results were obtained from both filters, the IMR of the real filter, (IMR$_{real}$) was 15.8 db and the IMR of the complex filter (IMR$_{complex}$) was 23.0 dB. Therefore, for this experiment, the complex low-pass filter was 7.2 dB better than the real low-pass filter.

§ 4.3 Exemplary Environment

FIG. 40 illustrates an exemplary quadrature direct conversion module 4000 (e.g., receiver), in which a complex low-pass filter of the present invention may be used. The module includes an input signal $x_{rf}$, two local oscillator signals lo$_1$ (I), lo$_2$ (Q), two mixers 4005, 4010, and a complex low-pass filter 4015.

An exemplary receiver operation will now be described. As shown in FIG. 40, an input signal, $x_{rf}$ is provided on two paths. Each instance of the input signal $x_{rf}$ is mixed with a local oscillator signal, where the two local oscillator signals, lo$_1$ (I) and lo$_2$ (Q), are in quadrature. The two resulting signals, x1 and x2, are input into the complex low-pass filter 4015. The complex low-pass filter is less sensitive to component mismatch. Therefore, the negative effects of filter (component) mismatch, which may cause unacceptable signal leakage if a real low-pass filter with the same filter (component) mismatch is used, is reduced (or eliminated). Then the filtered signals, y1 and y2, are processed to reform the transmitted signal.

Exemplary complex low-pass filters that reduce the negative effects of filter (component) mismatch were described in §§ 4.1.and 4.2. Such filters can be used as the complex low-pass filter 4015 of the receiver 4000, but are not limited to such applications.

Although the principles of the present invention were described as being implemented in physical (e.g., hardware) components, these principles can be applied to software processing of a complex signal.

§ 4.4 CONCLUSIONS

The experimental results described above show that a complex low-pass filter design of the present invention is less sensitive to circuit imperfections than a real low-pass filter subjected to the same imperfections. The present invention is even more effective when used with higher order filters, particularly when the refined cascade order of the present invention is employed. Thus a higher degree of component mismatch can be tolerated and higher yield can be achieved for the same component mismatch. In addition, since a complex low-pass filter comprises a similar amount of critical components as that of a real low-pass filter (of the same order), using complex low-pass filters does not increase the hardware complexity to an unacceptable degree.

What is claimed is:

1. A low-pass filter comprising:
   a) a first filter section, the first filter section having
      i) first inputs for accepting signals in quadrature, and
      ii) a first sub-section for effecting a first single pole transfer function on the signals accepted by the first inputs, to generate intermediate output signals; and
   b) a second filter section, the second filter section having
      i) second inputs for accepting the intermediate output signals generated by the first sub-section of the first filter section, and
      ii) a second sub-section for effecting a second single pole transfer function on the signals accepted by the second inputs to generate a filtered signals,
   wherein the first single pole transfer function and the second single pole transfer function collectively define a conjugate pair of poles.

2. The low-pass filter of claim 1 wherein the first sub-section of the first filter section includes
   A) a first mixer having three inputs and one output, a first input of the first mixer being coupled with one of the first inputs of the first filter section,
   B) a second mixer having three inputs and one output, a first input of the second mixer being coupled with another of the first inputs of the first filter section,
   C) a first integrator having an input coupled with the output of the first mixer, and having an output,
   D) a second integrator having an input coupled with the output of the second mixer and having an output,
   E) a first amplifier having a first gain, having an input coupled with the output of the first integrator, and having an output coupled with a second input of the first mixer,
   F) a second amplifier having a second gain, having an input coupled with the output of the second integrator, and having an output coupled with a third input of the first mixer,
   G) a third amplifier having a third gain substantially equal to the second gain, having an input coupled with the output of the first integrator, and having an output coupled with a second input of the second mixer, and
   H) a fourth amplifier having a fourth gain substantially equal to the first gain, having an input coupled with the output of the second integrator, and having an output coupled with a third input of the second mixer.

3. The low-pass filter of claim 2 wherein the first input of the first mixer is a summing input, the second input of the first mixer is a difference input, the third input of the first mixer is a difference input, the first input of the second mixer is a summing input, the second input of the second mixer is a summing input and the third input of the second mixer is a difference input.

4. The low-pass filter of claim 3 wherein the second sub-section of the second filter section includes
   A) a third mixer having three inputs and one output, a first input of the third mixer being coupled with one of the second inputs of the second filter section,
   B) a fourth mixer having three inputs and one output, a first input of the fourth mixer being coupled with another of the second inputs of the second filter section,
   C) a third integrator having an input coupled with the output of the third mixer, and having an output,
   D) a fourth integrator having an input coupled with the output of the fourth mixer and having an output,
   E) a fifth amplifier having a fifth gain substantially equal to the first gain, having an input coupled with the output of the third integrator, and having an output coupled with a second input of the third mixer,
   F) a sixth amplifier having a sixth gain being substantially equal to the second gain, having an input coupled with the output of the fourth integrator, and having an output coupled with a third input of the third mixer,
   G) a seventh amplifier having a seventh gain substantially equal to the second gain, having an input coupled with the output of the third integrator, and having an output coupled with a second input of the fourth mixer, and
   H) an eighth amplifier having an eighth gain substantially equal to the first gain, having an input coupled with the output of the fourth integrator, and having an output coupled with a third input of the fourth mixer,
   wherein the first input of the third mixer is a summing input, the second input of the third mixer is a difference input, the third input of the third mixer is a summing input, the first input of the fourth mixer is a summing input, the second input of the fourth mixer is a difference input and the third input of the fourth mixer is a difference input.

5. The low-pass filter of claim 1 wherein the first filter section has a positive pole, a negative pole, and a zero, and wherein the zero of the first filter section has essentially the same polar coordinates as the negative pole of the first filter section.

6. The low-pass filter of claim 5 wherein the second filter section has a positive pole, a negative pole, and a zero, and wherein the zero of the second filter section has essentially the same polar coordinates as the positive pole of the second filter section.

7. The low-pass filter of claim 1 wherein the first filter section has a positive pole, a negative pole, and a zero, and wherein the zero of the first filter section has essentially the same polar coordinates as the positive pole of the first filter section.

8. The low-pass filter of claim 7 wherein the second filter section has a positive pole, a negative pole, and a zero, and wherein the zero of the second filter section has essentially the same polar coordinates as the negative pole of the second filter section.

9. A low-pass filter comprising N sections, each of the N sections effecting a single pole transfer function, and each of the N sections having a corresponding section defining a conjugate pair of poles,
   wherein each of the poles has a Q value,
   wherein N is at least three, and
   wherein the N sections are cascaded in an order in which the first section of the cascade order has a pole with a lowest Q value and in which the last section of the cascade order has a pole with a lowest Q value.

10. The low-pass filter of claim 9 wherein N is an even number of at least four.

11. The low-pass filter of claim 10 wherein, in the cascade order, a section with a negative pole immediately follows a section with a positive pole, and a section with a positive pole immediately follows a section with a negative pole.

12. low-pass filter of claim 11 wherein, in a first half of the cascade order, the Q value of the poles of the sections increases with each successive section and in a second half of the cascade order, the Q value of the poles of the sections decreases with each successive section.

13. The low-pass filter of claim 10 wherein, in a first half of the cascade order, the Q value of the poles of the sections increases with each successive section and in a second half of the cascade order, the Q value of the poles of the sections decreases with each successive section.

14. The low-pass filter of claim 9 wherein each of half of the sections includes
 a) a first mixer having three inputs and one output, a first input of the first mixer being coupled with an input of the section,
 b) a second mixer having three inputs and one output, a first input of the second mixer being coupled with another input of the section,
 c) a first integrator having an input coupled with the output of the first mixer, and having an output,
 d) a second integrator having an input coupled with the output of the second mixer and having an output,
 e) a first amplifier having a first gain, having an input coupled with the output of the first integrator, and having an output coupled with a second input of the first mixer,
 f) a second amplifier having a second gain, having an input coupled with the output of the second integrator, and having an output coupled with a third input of the first mixer,
 g) a third amplifier having a third gain substantially equal to the second gain, having an input coupled with the output of the first integrator, and having an output coupled with a second input of the second mixer, and
 h) a fourth amplifier having a fourth gain substantially equal to the first gain, having an input coupled with the output of the second integrator, and having an output coupled with a third input of the second mixer.

15. The low-pass filter of claim 14 wherein each of the other half of the sections includes
 a) a third mixer having three inputs and one output, a first input of the third mixer being coupled with an input of the section,
 b) a fourth mixer having three inputs and one output, a first input of the fourth mixer being coupled with another input of the section,
 c) a third integrator having an input coupled with the output of the third mixer, and having an output,
 d) a fourth integrator having an input coupled with the output of the fourth mixer and having an output,
 e) a fifth amplifier having a fifth gain substantially equal to the first gain, having an input coupled with the output of the third integrator, and having an output coupled with a second input of the third mixer,
 f) a sixth amplifier having a sixth gain being substantially equal to the second gain, having an input coupled with the output of the fourth integrator, and having an output coupled with a third input of the third mixer,
 g) a seventh amplifier having a seventh gain substantially equal to the second gain, having an input coupled with the output of the third integrator, and having an output coupled with a second input of the fourth mixer, and
 h) an eighth amplifier having an eighth gain substantially equal to the first gain, having an input coupled with the output of the fourth integrator, and having an output coupled with a third input of the fourth mixer,
 wherein the first input of the third mixer is a summing input, the second input of the third mixer is a difference input, the third input of the third mixer is a summing input, the first input of the fourth mixer is a summing input, the second input of the fourth mixer is a difference input and the third input of the fourth mixer is a difference input.

16. A method for low-pass filtering a signal, the method comprising:
 a) mixing the signal with an in-phase signal to generate an I signal;
 b) mixing the signal with a quadrature signal to generate a Q signal;
 c) applying the I signal and the Q signal to a first filter section for effecting a first single pole transfer function on the I and Q signals, to generate intermediate output signals; and
 d) applying the intermediate output signals to a second filter section for effecting a second single pole transfer function on the intermediate signals to generate a filtered signals,
  wherein the first single pole of the first filter section and the second single pole of the second filter section collectively define a conjugate pair.

17. A method for low-pass filtering a signal, the method comprising:
 a) mixing the signal with an in-phase signal to generate an I signal;
 b) mixing the signal with a quadrature signal to generate a Q signal;
 c) applying the I signal and the Q signal to a low-pass filter comprising N sections, each of the N sections effecting a single pole transfer function, and each of the N sections having a corresponding section defining a conjugate pair of poles, wherein each of the poles has a Q value, wherein N is at least three, and wherein the N sections are cascaded in an order in which the first section of the cascade order has a pole with a lowest Q value and in which the last section of the cascade order has a pole with a lowest Q value.

18. The method of claim 17 wherein N is an even number of at least four.

19. The method of claim 18 wherein, in the cascade order, a section with a negative pole immediately follows a section with a positive pole, and a section with a positive pole immediately follows a section with a negative pole.

20. The method of claim 19 wherein, in a first half of the cascade order, the Q value of the poles of the sections increases with each successive section and in a second half of the cascade order, the Q value of the poles of the sections decreases with each successive section.

21. A low pass filter comprising:
 (a) a first filter process section, the first filter process section having a
  i) a first input for accepting a complex signal and
  ii) a first processing sub-section for effecting a first single pole transfer function on the signals accepted by the first input, to generate intermediate output signals; and (b) a second filter process section, the second filter processing section having
  i) a second input for accepting the intermediate output signals generated by the first filter process section, and
  ii) a second processing sub-section for effecting a second single pole transfer function on the signals accepted by the second inputs to generate a filtered signals, wherein the first single pole transfer function and the second single pole transfer function collectively define a conjugate pair of poles.

* * * * *